United States Patent [19]

Igarashi

[11] Patent Number: 5,096,533
[45] Date of Patent: Mar. 17, 1992

[54] MOLECULAR BEAM EPITAXIAL GROWTH DEVICE AND MOLECULAR BEAM CONTROL METHOD THEREIN FOR EXACTLY CONTROLLING THICKNESS AND COMPOSITION OF EPITAXIAL FILM

[75] Inventor: Takeshi Igarashi, Atsugi, Japan

[73] Assignee: Fujitsu Limited, Kawasaki, Japan

[21] Appl. No.: 672,558

[22] Filed: Mar. 20, 1991

[30] Foreign Application Priority Data

Mar. 20, 1990 [JP] Japan .................................. 02-70894

[51] Int. Cl.$^5$ ............................................ C30B 25/16
[52] U.S. Cl. ..................................... 156/601; 156/611;
156/612; 156/DIG. 103; 437/8; 437/105;
437/107; 250/252.1
[58] Field of Search ........................ 156/601, 610–614,
156/DIG. 103; 437/105, 8, 107; 250/424,
492.2, 492.3, 252.1, 302; 422/105, 109

[56] References Cited

U.S. PATENT DOCUMENTS

| | | | |
|---|---|---|---|
| 3,839,084 | 10/1974 | Cho et al. ........................... | 156/611 |
| 4,119,846 | 10/1978 | Outhwaite et al. ................ | 250/252.1 |
| 4,636,268 | 1/1987 | Tsang ................................. | 156/611 |
| 4,855,013 | 8/1989 | Ohta et al. ......................... | 156/601 |

FOREIGN PATENT DOCUMENTS

| | | | |
|---|---|---|---|
| 53-125761 | 11/1978 | Japan ................................. | 437/105 |
| 55-52220 | 4/1980 | Japan ................................. | 437/105 |
| 58-33824 | 2/1983 | Japan ................................. | 437/105 |
| 58-119630 | 7/1983 | Japan ................................. | 437/105 |
| 2-26888 | 1/1990 | Japan ................................. | 156/601 |

Primary Examiner—Robert Kunemund
Attorney, Agent, or Firm—Staas & Halsey

[57] ABSTRACT

A measured molecular beam intensity $V_i$ is converted into a value $V_{io}$ at a reference temperature $T_O$ by calculating the following equation using the measured molecular beam intensity $V_i$ and a measured cell temperature $T_i$: $V_{io}=V_i \cdot \exp(A(1/T_O-1/T_i))$. Next, a molecular beam intensity $V_o(t)$ at a time (t) is estimated after the last conversion time based on the reference temperature $T_o$ in accordance with the converted molecular beam intensity $V_{io}$ and a corresponding time $t_i$ thereof. Further, the temperature of a molecular beam source cell is controlled in accordance with an estimated cell temperature $T_{SP}(V_{SP})$, to realize a predetermined molecular beam intensity $V_{SP}$, given by calculating the following equation using the estimated molecular beam intensity $V_o(t)$ and the predetermined molecular beam intensity $V_{SP}$: $T_{SP}(V_{SP})=1/(1/T_O+(\log(V_{SP}/V_o(t)))/A)$.

12 Claims, 8 Drawing Sheets

MOLECULAR BEAM EPITAXIAL GROWTH DEVICE AND MOLECULAR BEAM CONTROL METHOD THEREIN FOR EXACTLY CONTROLLING THICKNESS AND COMPOSITION OF EPITAXIAL FILM

BACKGROUND OF THE INVENTION

1. Field of the Invention

The present invention relates to molecular beam epitaxial technology, more particularly, to a molecular beam epitaxial growth device and a molecular beam control method therein for exactly controlling a thickness and a composition of an epitaxial film.

2. Description of the Related Art

Recently, a laser diode and a high electron mobility transistor (HEMT) having a low noise and a high speed operation, which include an epitaxial growth (epitaxial film) formed by a molecular beam epitaxial growth device, have been developed and provided. For example, in accordance with the improvement of semiconductor integrated circuits comprising the HEMT device, it is required to exactly control the thickness or composition of the epitaxial film and to increase the yield rate of the semiconductor devices.

In the prior molecular beam epitaxial growth method (MBE: Molecular Beam Epitaxy), the intensity of a molecular beam is controlled by manually controlling the temperature of a molecular beam source cell to obtain a preferable epitaxial growth rate. Note, in order to measure the intensity of the molecular beam from the molecular beam source cell, a molecular beam flux measurement method using an ion gauge, an epitaxial growth rate measurement method by observing an oscillation of an RHEED (reflective high energy electron diffraction), or an epitaxial growth method for measuring a thickness of the film, have been used.

Note, even though the temperature of the molecular beam source cell is maintained at a specific value, the intensity of the molecular beam (molecular beam intensity) becomes varied in accordance with a decrease in quantity of the molecular beam source provided in the cell (molecular beam source cell), so that the epitaxial growth rate or the composition of the epitaxial film cannot be maintained at a constant preferable value. Therefore, in the prior art, the measurement of the molecular beam intensity must be frequently carried out and the cell temperature must be frequently corrected in accordance with the measured molecular beam intensity to maintain the epitaxial growth rate or the composition of the epitaxial film at the constant value.

Nevertheless, when correcting the cell temperature, the molecular beam epitaxial growth for forming a practical device (for example, HEMT device) should be carried out after stabilizing the molecular beam intensity or after again confirming the molecular beam intensity, and thus a long time is required before starting the molecular beam epitaxial growth for forming the HEMT device. Furthermore, the correction of the cell temperature is carried out in accordance with an operator's experience or intuition, so that the molecular beam intensity cannot be determined within the specific allowable range and the thickness or the composition of the epitaxial film cannot be exactly controlled.

SUMMARY OF THE INVENTION

It is an object of the present invention to provide a molecular beam control method to exactly control the thickness or composition of the epitaxial film and to increase the yield rate of semiconductor devices using the epitaxial film, without depending on an operator's experience or his intuition. Furthermore, it is also an object of the present invention to provide a molecular beam epitaxial growth device using the above molecular beam control method to exactly control the thickness or the composition of the epitaxial film and to increase the yield rate of semiconductor devices using the epitaxial film.

According to the present invention, there is provided a molecular beam control method in a molecular beam epitaxial growth device comprising the steps of: measuring a temperature $T_i$ of a molecular beam source cell; measuring an intensity $V_i$ of a molecular beam from the molecular beam source cell; converting the measured molecular beam intensity $V_i$ into a value $V_{iO}$ at a reference temperature $T_O$ by calculating the following equation using the measured molecular beam intensity $V_i$ and the measured cell temperature $T_i$;

$$V_{io} = V_i \cdot \exp\left(A\left(\frac{1}{T_o} - \frac{1}{T_i}\right)\right)$$

estimating a molecular beam intensity $V_O(t)$ at a time (t) after the last conversion time based on the reference temperature $T_O$ in accordance with the converted molecular beam intensity $V_{iO}$ and a corresponding time $t_i$ thereof; and controlling a temperature of the molecular beam source cell in accordance with an estimated cell temperature $T_{SP}(V_{SP})$, to realize a predetermined molecular beam intensity $V_{SP}$, given by calculating the following equation using the estimated molecular beam intensity $V_O(t)$ and the predetermined molecular beam intensity $V_{SP}$.

$$T_{SP}(V_{SP}) = \frac{1}{\frac{1}{T_0} + \frac{1}{A}\log\frac{V_{SP}}{V_O(t)}}$$

According to the present invention, there is also provided a molecular beam control method in a molecular beam epitaxial growth device comprising the steps of: measuring a temperature $T_i$ of a molecular beam source cell; measuring an intensity $V_i$ of a molecular beam from the molecular beam source cell; converting the measured molecular beam intensity $V_i$ into a value $V_{iO}$ at a reference temperature $T_O$ by calculating the following equation using the measured molecular beam intensity $V_i$ and the measured cell temperature $V_i$;

$$V_{io} = V_i \cdot \exp\left(A\left(\frac{1}{T_o} - \frac{1}{T_i}\right)\right)$$

estimating a molecular beam intensity $V_O(t)$ at a time (t) after the last conversion time based on the reference temperature $T_O$ in accordance with the converted molecular beam intensity $V_{iO}$ and a corresponding time $t_i$ thereof; calculating a molecular beam intensity $V_{SP}(T_{SP})$ at a cell temperature $T_{SP}$ by calculating the following equation using the estimated molecular beam intensity $V_O(t)$ and the cell temperature $T_{SP}$ at the time (t) of the estimated molecular beam intensity $V_O(t)$;

$$V_{SP}(T_{SP}) = V_O(t) \cdot \exp\left(A\left(\frac{1}{T_{SP}} - \frac{1}{T_O}\right)\right)$$

and controlling a shutter of the molecular beam source cell by using an integrated value relating to the time factor of the molecular beam intensity $V_{SP}(T_{SP})$.

The step of measuring the temperature $T_i$ of the molecular beam source cell and the step of measuring the intensity $V_i$ of the molecular beam from the molecular beam source cell may be carried out at the time of growing a buffer layer on a substrate, and the step of controlling the temperature of the molecular beam source cell may be carried out at a time of growing a device layer on the substrate. The step of measuring the temperature $T_i$ of the molecular beam source cell and the step of measuring the intensity $V_i$ of the molecular beam from the molecular beam source cell may be carried out when stopping the growth of an epitaxial film.

The molecular beam control method is used for forming a compound semiconductor made of group III-V materials. The group III materials may include Aluminum, Gallium, or Indium, and the group V materials may include Phosphorus, Antimony or Arsenic.

The step of measuring the temperature $T_i$ of the molecular beam source cell and the step of measuring the intensity $V_i$ of the molecular beam from the molecular beam source cell may be carried out for only the group III materials.

Furthermore, according to the present invention, there is provided a molecular beam epitaxial growth device comprising: a vacuum chamber; at least one molecular beam source cell having a heating unit, provided in the vacuum chamber, for heating and evaporating molecular beam source material in each of the molecular beam source cells; a shutter, provided in the vacuum chamber for each of the molecular beam source cells, for controlling the quantity of the molecular beam evaporated from the molecular beam source cell; a cell temperature measurement unit, for measuring a temperature $T_i$ of each of the molecular beam source cells; a cell temperature control unit, connected to the heating unit of each of the molecular beam source cells, for controlling the temperature of each molecular beam source cell; a molecular beam intensity measurement unit, for measuring an intensity $V_i$ of a molecular beam evaporated from each of the molecular beam source cells; a molecular beam intensity conversion unit, receiving the molecular beam intensity $V_i$ measured by the molecular beam intensity measurement unit and the cell temperature $T_i$ measured by the cell temperature measurement unit, for converting the measured molecular beam intensity $V_i$ into a value $V_{iO}$ at a reference temperature $T_O$ by calculating the following equation using the measured molecular beam intensity $V_i$ and the measured cell temperature $T_i$;

$$V_{io} = V_i \cdot \exp\left(A\left(\frac{1}{T_o} - \frac{1}{T_i}\right)\right)$$

a memory unit, receiving the converted molecular beam intensity $V_{iO}$ and a corresponding time $t_i$ of each converted molecular beam intensity $V_{iO}$, for successively storing the converted molecular beam intensity $V_{iO}$ and the corresponding time $t_i$ thereof; a molecular beam intensity estimation unit, for successively reading out the estimated molecular beam intensity $V_{iO}$ and the corresponding time $t_i$ thereof, and for estimating a molecular beam intensity $V_O(t)$ at a time (t) after the last converted and stored time based on the reference temperature $T_O$ in accordance with the converted molecular beam intensity $V_{iO}$ and the corresponding time $t_i$ thereof; and a cell temperature calculation unit, for calculating a cell temperature $T_{SP}(V_{SP})$, to realize a predetermined molecular beam intensity $V_{SP}$, given by successively inputting the estimated molecular beam intensity $V_O(t)$ and a predetermined molecular beam intensity $V_{SP}$ into the following equation, and for successively inputting the calculated cell temperature $T_{SP}(V_{SP})$ as an objective temperature into the cell temperature control unit.

$$T_{SP}(V_{SP}) = \frac{1}{\frac{1}{T_0} + \frac{1}{A} \log \frac{V_{SP}}{V_O(t)}}$$

In addition, there is also provided a molecular beam epitaxial growth device comprising: a vacuum chamber; at lest one molecular beam source cell having a heating unit, provided in the vacuum chamber, for heating and evaporating molecular beam source material in each of the molecular beam source cells; a shutter, provided in the vacuum chamber and for each of the molecular beam source cells, for controlling the quantity of the molecular beam evaporated from each molecular beam source cells; a cell temperature measurement unit, for measuring a temperature $T_i$ of each of the molecular beam source cells; a cell temperature control unit, connected to the heating unit of each of the molecular beam source cell, for controlling the temperature of the molecular beam source cell; a molecular beam intensity measurement unit, for measuring an intensity $V_i$ of a molecular beam evaporated from each of the molecular beam source cells; a molecular beam intensity conversion unit, receiving the molecular beam a intensity $V_i$ measured by the molecular beam intensity measurement unit and the cell temperature $T_i$ measured by the cell temperature measurement unit, for converting the measured molecular beam intensity $V_i$ into a value $V_{iO}$ at a reference temperature $T_O$ by calculating the following equation using the measured molecular beam intensity $V_i$ and the measured cell temperature $T_i$;

$$V_{io} = V_i \cdot \exp\left(A\left(\frac{1}{T_o} - \frac{1}{T_i}\right)\right)$$

a memory unit, receiving the converted molecular beam intensity $V_{iO}$ and a corresponding time $t_i$ of each converted molecular beam intensity $V_{iO}$, for successively storing the converted molecular beam intensity $V_{iO}$ and the corresponding time $t_i$ thereof; a molecular beam intensity estimation unit, for successively reading out the estimated molecular beam intensity $V_{iO}$ and the corresponding time $t_i$ thereof, and for estimating a molecular beam intensity $V_O(t)$ at a time (t) after the last converted and stored time based on the reference temperature $T_O$ in accordance with the converted molecular beam intensity $V_{iO}$ and the corresponding time $t_i$ thereof; a molecular beam intensity calculation unit, for calculating a molecular beam intensity $V_{SP}(V_{SP})$ at a cell temperature $T_{SP}$ in the time (t) of the estimated molecular beam intensity $V_O(t)$ by successively inputting the estimated molecular beam intensity $V_0(t)$ and the cell temperature $T_{SP}$ into the following equation;

$$V_{SP}(T_{SP}) = V_0(t) \cdot \exp\left(A\left(\frac{1}{T_{SP}} - \frac{1}{T_0}\right)\right)$$

and a shutter control unit, connected to the shutter of each of the molecular beam source cells and receiving the calculated molecular beam intensity $V_{SP}(T_{SP})$, for controlling the shutter in accordance with an integrated value relating to the time factor of the molecular beam intensity $V_{SP}(T_{SP})$.

The molecular beam intensity estimation unit may estimate the molecular beam intensity $V_0(t)$ corresponding to the time after the last converted and stored time, by successively reading out the estimated molecular beam intensity $V_{i0}$ and the corresponding time $t_i$ thereof stored in the memory unit, by assuming an empirical formula $\log\{V_0(t)\} = C_0 + C_1 t$, by calculating coefficients $C_0$ and $C_1$ by minimizing the sum of square value $\Sigma D_i^2$ in the difference $D_i = \log(V_{i0} - (C_0 + C_1 t_i))$, and by carrying out the equation $V_0(t) = \exp(C_0 + C_1 t)$.

The molecular beam intensity estimation unit may estimate the molecular beam intensity $V_0(t)$ corresponding to the time after the last converted and stored time, by successively reading out the estimated molecular beam intensity $V_{i0}$ and the corresponding time $T_i$ thereof stored in the memory unit, by assuming an empirical formula $V_0(t) = C_0' + C_1' t$, by calculating coefficients $C_0'$ and $C_1'$ by minimizing the sum of square value $\Sigma D_i'^2$ in the difference $D_i' = V_{i0} - (C_0' + C_1' t_i)$, and by carrying out the equation $V_0(t) = C_0' + C_1' t$.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, a principle of a molecular beam control method according to the present invention will be first explained with reference to FIGS. 1 and 2.

Figure 1:
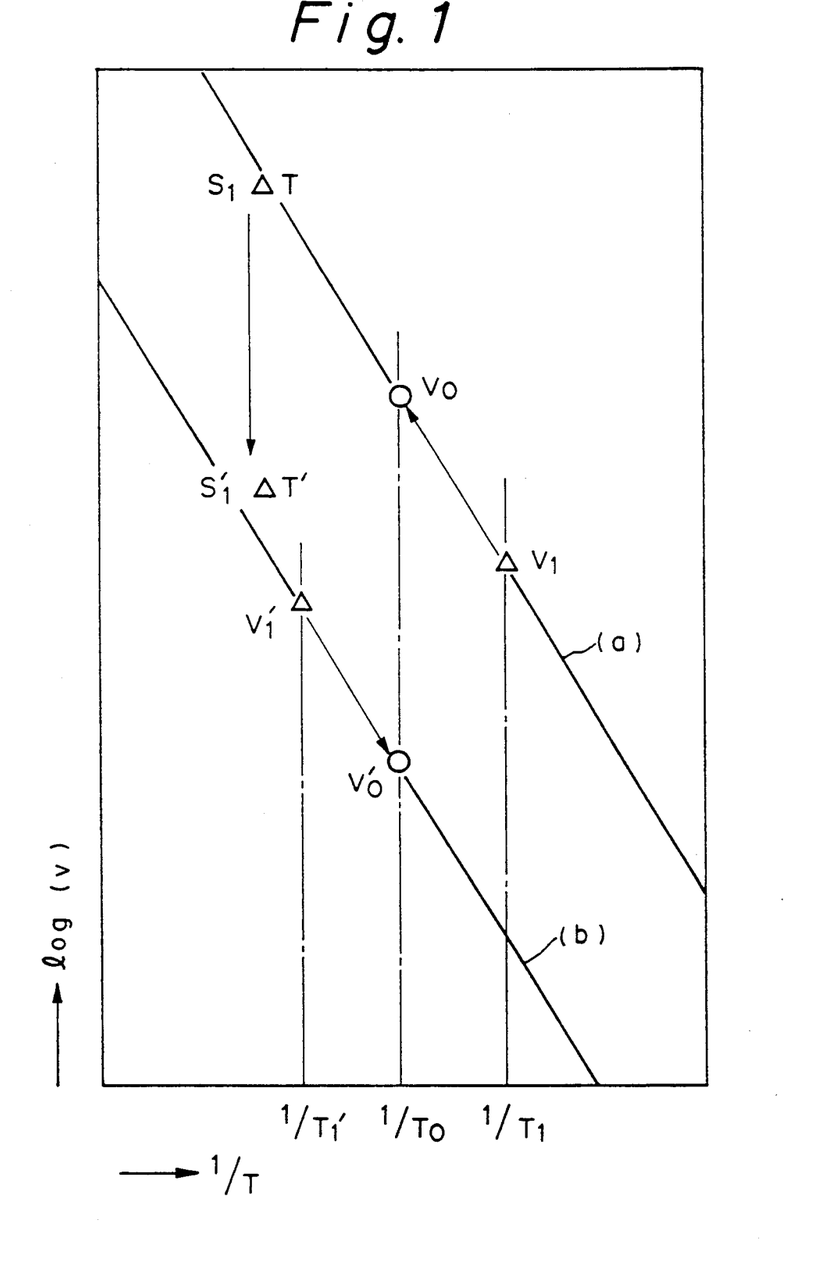
FIGS. 1 and 2 are diagrams for explaining a principle of the present invention.

FIG. 1 is a diagram for explaining a principle of the present invention, more particularly, is a graph indicating the relationship between [log V] and [1/T]. In FIG. 1, a reference V denotes a molecular beam intensity, and a reference V denotes a molecular beam intensity, and a reference T denotes a temperature of a molecular beam source cell.

First, a temperature $T_{source}$ of a molecular beam source provided in a molecular beam source cell and a vapor pressure P of the molecular beam source can be indicated by the following approximate equation (1):

$$\log P = A/T_{source} + B \tag{1}$$

wherein, the references A and B, which are determined in accordance with the kind of molecular beam source material, are constants.

Further, a molecular beam intensity V is proportional to the product of the vapor pressure P and a surface size S of the molecular beam source, and thus the following equation (2) can be applied.

$$\begin{aligned}\log V &+ \log(K\,P\,S) \\ &= A/T_{source} + B + \log S + \log K \\ &= A/T + B + \log S + \log K\end{aligned} \tag{2}$$

In this equation, the reference K is a constant, and a temperature (cell temperature) T of the molecular beam source cell is assumed to be equal to the temperature (source temperature) $T_{source}$ of the molecular beam source provided in the molecular beam source cell.

As indicated in FIG. 1, when making a graph of the relationship between [log V] and (8 1/T], a straight line (a) can be obtained. Note, the slope of the straight line (a) is determined by the value of the constant A, that is, the slope of the straight line (a) is determined in accordance with the kind of the molecular beam source material. In the equation (2), when the surface size S of the molecular beam source is changed to a surface size S' by decreasing the molecular beam source, the relationship between [log V] and [1/T] is changed from the straight line (a) to a straight line (b) shown in FIG. 1. It is apparent from FIG. 1 that a slope of the straight line (b) is equal to that of the straight line (a), when the material is the same.

Next, the case when a temperature difference $\Delta T$ exists between the source temperature (temperature of the molecular beam source) $T_{source}$ and the cell temperature (temperature of the molecular beam source cell) T will be considered. When $\Delta T << T$, the molecular beam intensity V is determined by the following equation.

$$\begin{aligned}\log V &= A/(T + \Delta T) + B + \log S + \log K \\ &= A/T(1 - \Delta T/T) + B + \log S + \log K \\ &= A/T - A\Delta T/T^2 + B + \log S + \log K\end{aligned}$$

Therefore, when the cell temperature T is restricted to a narrow range, the following equation (3) is applied by choosing an arbitrary temperature $T_0$ in the range.

$$\log V \approx A/T - A\Delta T/T_0^2 + B + \log S + \log K \tag{3}$$

In this equation (3), when the temperature difference $\Delta T$ between the source temperature $T_{source}$ and the cell temperature T is changed, a straight line indicating the relationship between [log V] and [1/T] is only shifted in parallel, i.e., a slope of the straight is not changed, the same as when the surface size S of the molecular beam source is changed (which is described above).

Namely, when the surface size S of the molecular beam source or the temperature difference $\Delta T$ between the source temperature $T_{source}$ and the cell temperature T is changed, a straight line indicating the relationship between [log V] and [1/T] is only shifted in parallel and the slope thereof is maintained, when the material of the molecular beam source is the same. Consequently, if only the slope of the straight line indicating the relationship between [log V] and [1/T] is previously known, a molecular beam intensity measured at an optional temperature can be converted to the molecular beam intensity $V_O$ at the reference temperature $T_O$.

With reference to FIG. 1, a concrete explanation will be given below. When a molecular beam intensity measured at a specific cell temperature $T_1$ is specified to $V_1$, a value of log $V_O$ is determined by an intersection point between the straight line (a) and a line of $1/T = 1/T_O$, and a molecular beam intensity $V_O$ at a reference temperature $T_O$ is converted by the value of log $V_O$. Note, the straight line (a) has a specific slope determined by a material of the molecular beam source. Similarly, when a surface size S of the molecular beam source is changed to a different surface size S', or when a temperature difference $\Delta T$ between the source temperature $T_{source}$ and the cell temperature T is changed, and a straight line (a) indicating the relationship between [log V] and [1/T] is changed to a straight line (b) shown in FIG. 1, a molecular beam intensity $V_O'$ at the reference temperature $T_O$ can be converted by using a molecular beam intensity $V_1'$ measured at a specific cell temperature $T_1'$.

The molecular beam intensity $V_O$ can be mathematically calculated by using the following equation (4), which is derived from two equations. Namely, one of the two equations is specified by substituting $T_O$ for T and $V_O$ for V in the equation (3), the other of the two equations is specified by substituting $T_1$ for T and $V_1$ for V in the equation (3), and then the equation (4) is obtained by replacing the constants B and K in the equation (3) by these two specified equations.

$$\log V_O = A(1/T_O - 1/T_1) + \log V_1 \quad (4)$$

As described above, a change with the passage of time of the molecular beam intensity can be apparent by successively calculating the molecular beam intensity $V_O$ at the reference temperature $T_O$, and furthermore, the molecular beam intensity can be also estimated.

Note, the following equations (5) and (6) are obtained by modifying the above equation (4) in accordance with the molecular beam intensity $V_O$ and the cell temperature $T_1$.

$$V_0 = V_1 \cdot \exp\left(A\left(\frac{1}{T_0} - \frac{1}{T_1}\right)\right) \quad (5)$$

$$T_1 = \frac{1}{\frac{1}{T_0} + \frac{1}{A}\log\frac{V_1}{V_0}} \quad (6)$$

Figure 2:
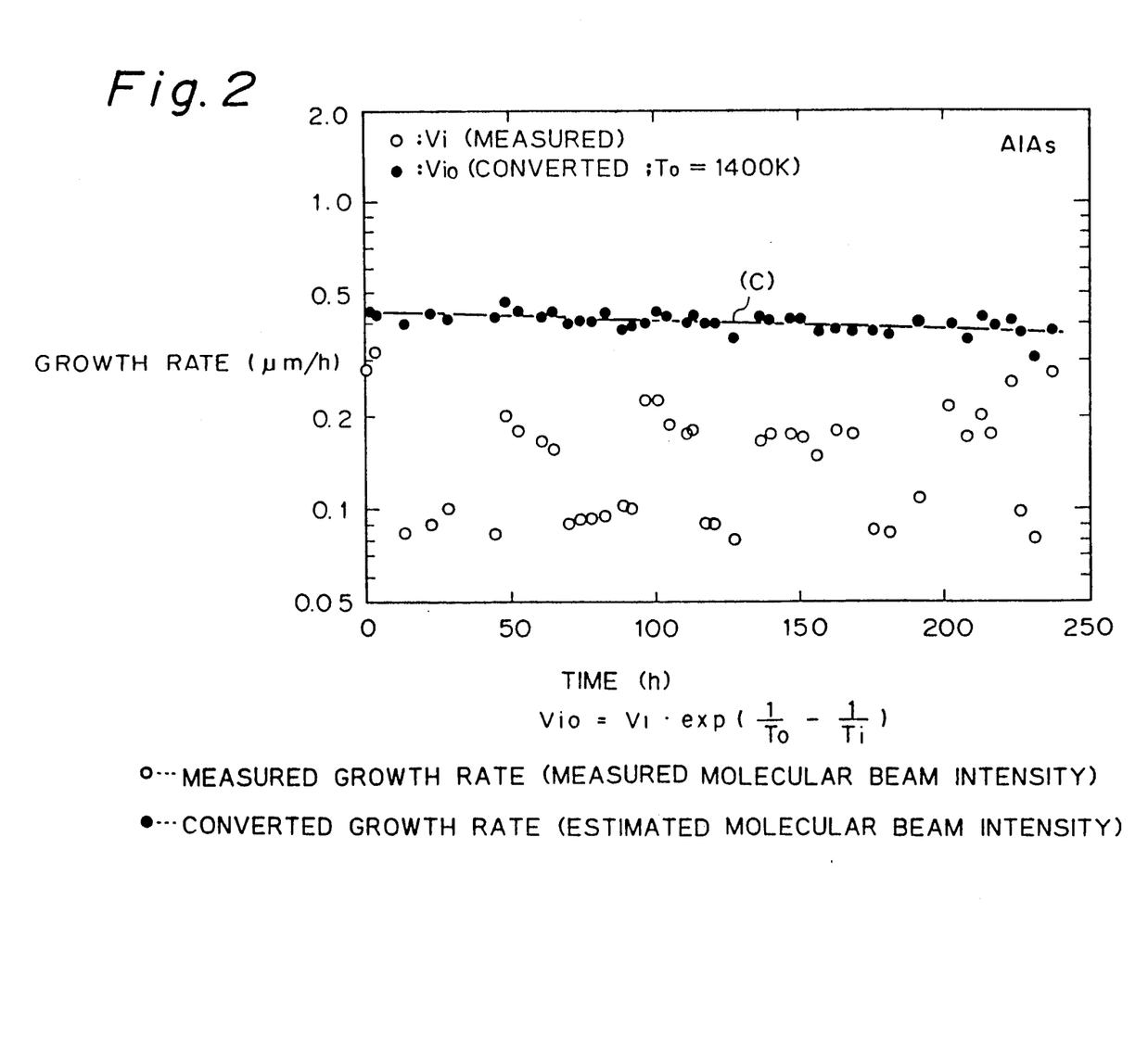

FIG. 2 is a diagram for explaining a principle of the present invention, more particularly, is a graph indicating a measured (or practical) and calculated (or present invention) relationship between the growth rate of AlAs (Aluminum Arsenide) and time. In the graph shown in FIG. 2, the vertical axis denotes a growth rate, which is proportional to a molecular beam intensity, and the horizontal axis denotes time. Note, the molecular beam intensity of group III elements can be represented by the growth rate, because all incident group III atoms stick on the III-V substrate or growing film. Furthermore, in FIG. 2, a measured growth rate (or a measured molecular beam intensity) $V_i$ of AlAs (Aluminum Arsenide) is plotted by a mark "○", and a converted growth rate (a converted molecular beam intensity) $V_{io}$ of AlAs is plotted by a mark "●". In addition, the material of Aluminum (Al) is included in the group III and the material of Arsenic (As) is included in the group V, and thus by controlling only the material Al in the group III, the material As in the group V is determined by combining it with the material Al.

Note, the molecular beam intensity $V_{iO}$ at a reference temperature $T_O$ (for example, 1400 K) was converted from the measured molecular beam intensity $V_i$ in accordance with the following equation(5'), which corresponds to the above equation (5). In the following equation (5'), a reference $T_i$ denotes a temperature of a molecular beam source cell (cell temperature) for Aluminum (Al).

$$V_{i0} = V_i \cdot \exp\left(A\left(\frac{1}{T_0} - \frac{1}{T_i}\right)\right) \quad (5')$$

As shown in FIG. 2, when changing the cell temperature $T_i$, the plot points "○" of the measured molecular beam intensity $V_i$ of AlAs dispersed. Nevertheless, as shown in FIG. 2, the plot points "●" of the converted molecular beam intensity $V_{iO}$ of AlAs oat the reference temperature $T_O$ (1400 K) were positioned along a straight line (c). Therefore, the molecular beam intensity $V_{iO}$ at the reference temperature $T_O$ (for example, 1400 K) was converted from the measured molecular beam intensity $V_i$ in accordance with the equation (5'), or the equation (5) of the present invention.

Note, as shown by the straight line (c), the converted molecular beam intensity $V_{iO}$ at the reference cell temperature $T_O$ maintained at a constant value for a short period of observation, and the converted molecular beam intensity $V_{iO}$ decreased gradually over a long period of observation.

As described above, according to a molecular beam control method of the present invention, first, a temperature $T_i$ of a molecular beam source cell is measured, an intensity $V_i$ of a molecular beam from the molecular beam source cell is measured, and then the measured molecular beam intensity $V_i$ is converted into a value $V_{iO}$ at a reference temperature $T_O$ by calculating the following equation using the measured molecular beam intensity $V_i$ and the measured cell temperature $T_i$.

$$V_{io} = V_i \cdot \exp\left(A\left(\frac{1}{T_o} - \frac{1}{T_i}\right)\right)$$

Next, a molecular beam intensity $V_O(t)$ at a time (t) after the last conversion time based on the reference temperature $T_O$ is estimated in accordance with the converted molecular beam intensity $V_{iO}$ and a corresponding time $t_i$ thereof, and then a temperature of the molecular beam source cell is controlled in accordance with an estimated cell temperature $T_{SP}(V_{SP})$, to realize a predetermined molecular beam intensity $V_{SP}$, given by calculating the following equation using the estimated molecular beam intensity $V_O(t)$ and the predetermined molecular beam intensity $V_{SP}$.

$$T_{SP}(V_{SP}) = \frac{1}{\frac{1}{T_0} + \frac{1}{A}\log\frac{V_{SP}}{V_O(t)}}$$

Furthermore, according to a molecular beam control method of the present invention, first, a temperature $T_i$ of a molecular beam source cell is measured, an intensity $V_i$ of a molecular beam from the molecular beam source cell is measured, and then the measured molecular beam intensity $V_i$ is converted into a value $V_{iO}$ at a reference temperature $T_O$ by calculating the following equation using the measured molecular beam intensity $V_i$ and the measured cell temperature $T_i$.

$$V_{io} = V_i \cdot \exp\left(A\left(\frac{1}{T_o} - \frac{1}{T_i}\right)\right)$$

Next, a molecular beam intensity $V_O(t)$ at a time (t) after the last conversion time based on the reference temperature $T_O$ is estimated in accordance with the converted molecular beam intensity $V_{iO}$ and a corresponding time $t_i$ thereof, and then a molecular beam intensity $V_{SP}(T_{SP})$ at a cell temperature $T_{SP}$ is calculated by calculating the following equation using the estimated molecular beam intensity $V_O(t)$ and the cell temperature $T_{SP}$ at the time (t) of the estimated molecular beam intensity $V_O(t)$.

$$V_{SP}(T_{SP}) = V_O(t) \cdot \exp\left(A\left(\frac{1}{T_{SP}} - \frac{1}{T_O}\right)\right)$$

Finally, a shutter of the molecular beam source cell is controlled by using an integrated value relating to the time factor of the molecular beam intensity $V_{SP}(T_{SP})$.

Figure 3:
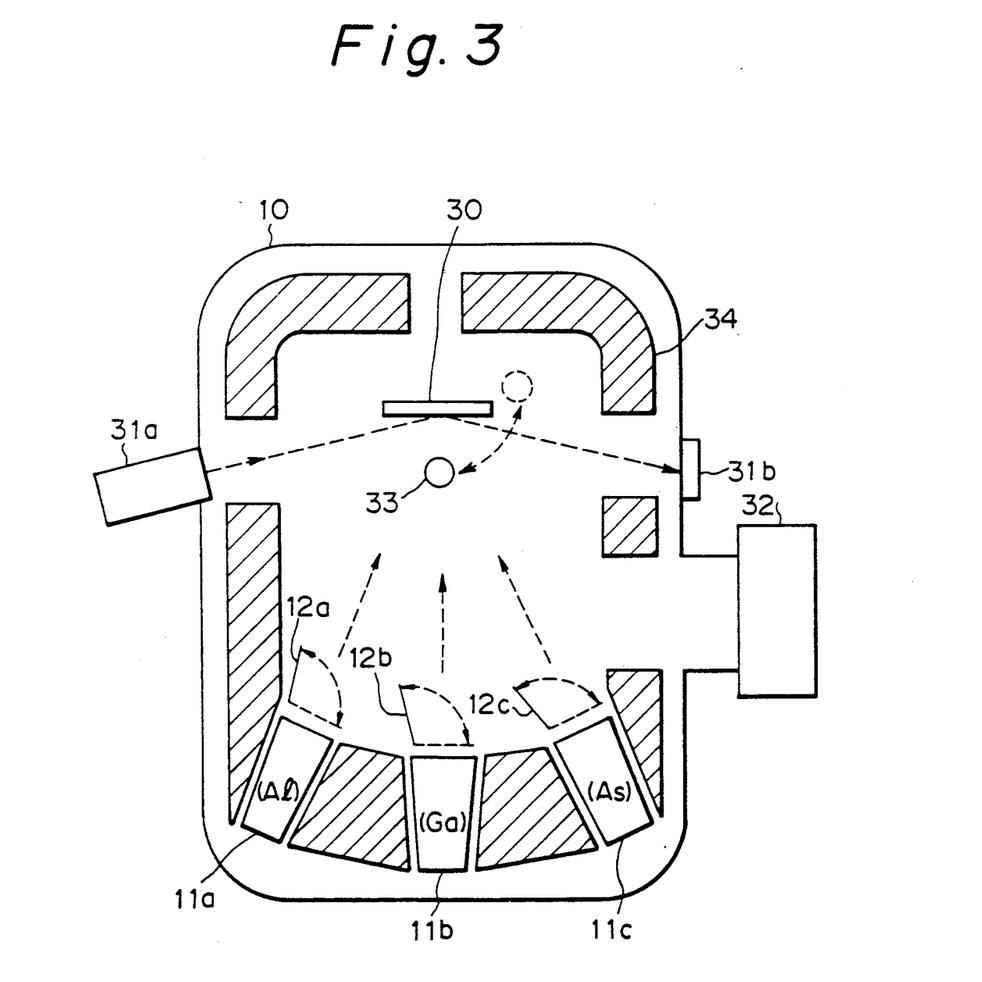
FIG. 3 is a schematic diagram illustrating a molecular beam epitaxial growth device.

FIG. 3 is a schematic diagram illustrating a molecular beam epitaxial growth device. In FIG. 3, a reference numeral 10 denotes a vacuum chamber, 11a,11b,11c denote molecular beam source cells, 12a,12b,12c denote shutters provided for the molecular beam source cells 11a,11b,11c, 30 denotes a substrate made of gallium arsenide (GaAs) where an epitaxial film is formed, 32 denotes an ion pump, and 34 denotes a liquid nitrogen shroud. Note, as shown in FIG. 3, a molecular beam source made of Aluminum (Al) is provided in the molecular beam source cell 12a, a molecular beam source made of Gallium (Ga) is provided in the molecular beam source cell 12b, a molecular beam source made of Arsenic (As) is provided in the molecular beam source cell 12c, and further, each of the shutters 12a,12b,12c can be movable for controlling the quantity of a molecular beam intensity evaporated from the corresponding molecular beam source cell 11a,11b,11c. In addition, a heating unit (for example, heating coil, which is not shown in FIG. 3) is provided for each of the molecular beam source cells 11a,11b,11c.

Furthermore, a reference numeral 31a denotes an RHEED gun, 31b denotes a fluorescent screen, and 33 denotes an ion gauge, and a group comprised of the RHEED gun 31a and the fluorescent screen 31b and the ion gauge 33 is used to measure the molecular beam intensity (or growth rate).

An electron beam output from the RHEED gun 31a is reflected by the surface of the substrate 30, and then the reflected electron beam arrives at the fluorescent screen 31b to brighten the screen or make it fluoresce. Note, a molecular beam intensity is calculated from fluctuating cycles of the brightness of the fluorescent screen 31b, especially, in the case of forming an epitaxial film of $Al_xGa_{1-x}As$, one molecular layer of the $Al_xGa_{1-x}As$ film corresponds to one fluctuation cycle, and thus the molecular beam intensity (or growth rate) can be easily calculated. Furthermore, in the normal condition of specifying a temperature of the substrate 30 of about 650° C., the growth rate of the epitaxial film is proportional to the molecular beam intensities of Al and Ga without relating to the molecular beam intensity of As. Consequently, the molecular beam intensity of Al can be calculated from the growth rate of AlAs, and the molecular beam intensity of Ga can be calculated from the growth rate of GaAs, by using the RHEED method.

As shown in FIG. 3, the ion gauge 33 can be movable from a front portion of the substrate 30 to a side portion thereof. Namely, when measuring a molecular beam intensity, the ion gauge 33 is placed at the front portion (indicated by a solid circle in FIG. 3) of the substrate 30, and when forming an epitaxial film on the surface of the substrate 30, the ion gauge 33 is placed at the side portion (indicated by a broken circle in FIG. 3) of the substrate 30. Note, for one of the molecular beam intensities of Al,Ga,As, one shutter of the corresponding molecular beam source cell is opened, and the specific one molecular beam intensity is calculated by a current value passing through the ion gauge 33.

In the above described molecular beam epitaxial growth device of FIG. 3, a molecular beam intensity can be measured by one of the RHEED gun 31a and the fluorescent screen 31b or the ion gauge 33, and thus both RHEED and ion gauge need not be provided for the molecular beam epitaxial growth device.

Below, the preferred embodiments of a molecular beam epitaxial growth device according to the present invention will be explained, with reference to FIGS. 4 to 8.

Figure 4:
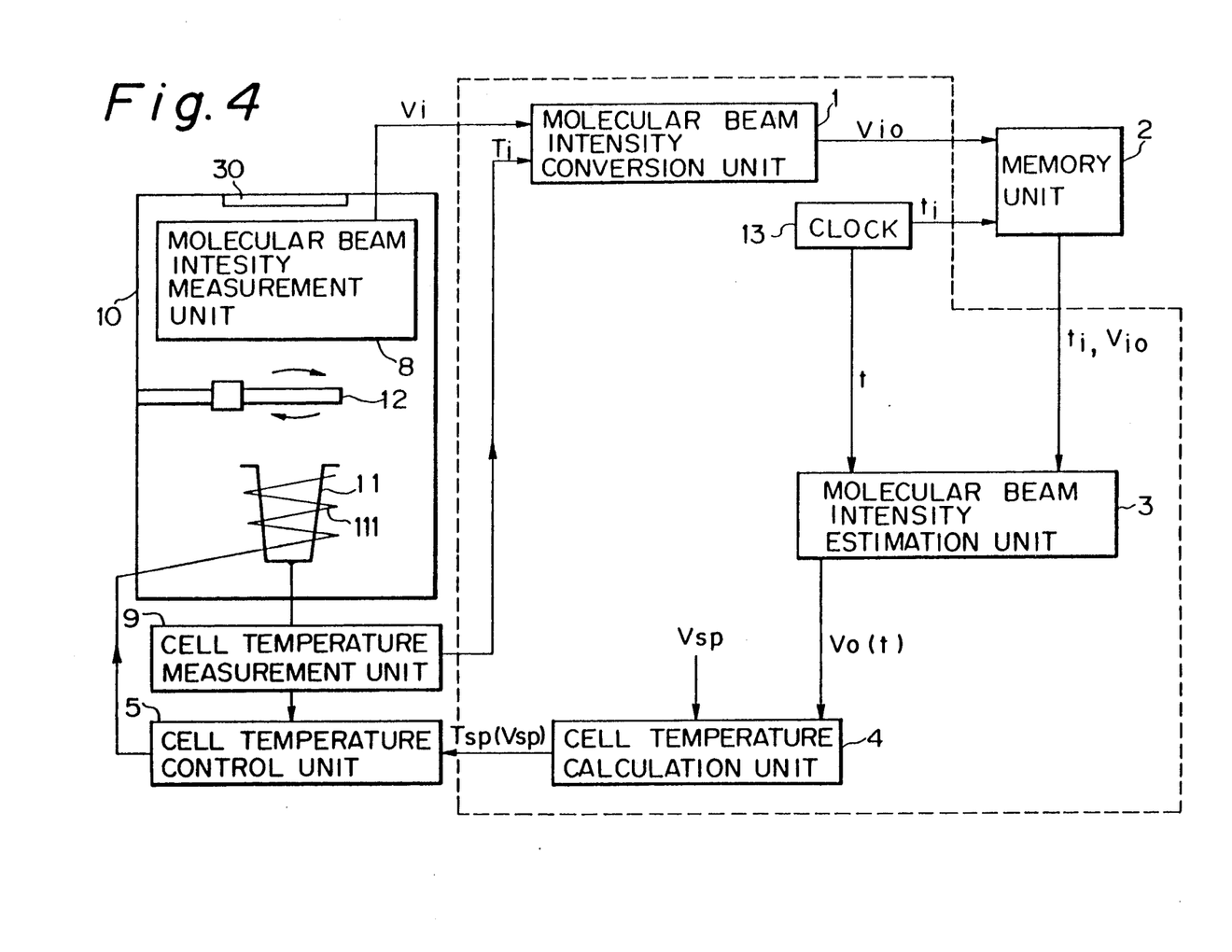
FIG. 4 is a block diagram illustrating a first embodiment of a molecular beam epitaxial growth device according to the present invention.

FIG. 4 is a block diagram illustrating a first embodiment of a molecular beam epitaxial growth device according to the present invention. In FIG. 4, a reference numeral 10 denotes a vacuum chamber, 11 denotes at least one molecular beam source cell, 12 denotes a shutter, 8 denotes a molecular beam intensity measurement unit, and 30 denotes a substrate which is for example, made of gallium arsenide (GaAs). Furthermore, in FIG. 4, a reference numeral 9 denotes a cell temperature measurement unit, 5 denotes a cell temperature control unit, 1 denotes a molecular beam intensity conversion unit, 2 denotes a memory unit, 13 denotes a clock, 3 denotes a molecular beam intensity estimation unit, and 4 denotes a cell temperature calculation unit.

Three molecular beam source cells 11, for example, are provided three as shown in FIG. 3, and a molecular beam source made of Aluminum (Al) is provided in the molecular beam source cell (12a), a molecular beam source made of Gallium (Ga) is provided in the molecular beam source cell (12b), and a molecular beam source made of Arsenic (As) is provided in the molecular beam source cell (12c). Further, each of the shutters 12 (12a,12b,12c) can be movable for controlling the quantity of a molecular beam intensity from the corresponding molecular beam source cell 11 (11a,11b,11c). The molecular beam intensity measurement unit 8 is used to measure an intensity $V_i$ of a molecular beam from the molecular beam source cell 11. Note, the molecular beam intensity measurement unit 8 is, for example, an RHEED, an ion gauge, and the like.

The cell temperature measurement unit 9 is used to measure a temperature $T_i$ of the molecular beam source cell 11. The cell temperature control unit 9 is connected to a heating unit 111 (for example, heating coil) of the molecular beam source cell 11 and is used to control the temperature of the molecular beam source cell 11. The molecular beam intensity conversion unit 1, which receives the molecular beam intensity $V_i$ measured by the molecular beam intensity measurement unit 8 and the cell temperature $T_i$ measured by the cell temperature measurement unit 9, is used to convert the measured molecular beam intensity $V_i$ into a value $V_{iO}$ at a reference temperature $T_O$ (for example, 1400 K) by calculating the following equation using the measured molecular beam intensity $V_i$ and the measured cell temperature $T_i$.

$$V_{io} = V_i \cdot \exp\left(A\left(\frac{1}{T_o} - \frac{1}{T_i}\right)\right)$$

The memory unit 2, which receives the converted (estimated) molecular beam intensity $V_{iO}$ and a corresponding time $t_i$ of each converted molecular beam intensity $V_{iO}$, is used to successively store the converted molecular beam intensity $V_{iO}$ and the corresponding time $t_i$ thereof. Note, the corresponding time $t_i$ is counted by the clock 13.

The molecular beam intensity estimation unit 3 is used to successively read out the converted molecular beam intensity $V_{iO}$ an the corresponding time $t_i$ thereof and a time t counted by the clock 13, and to estimate a molecular beam intensity $V_O(t)$ at a time(t) after the last converted and stored time based on the reference temperature $T_O$ in accordance with the converted molecular beam intensity $V_{iO}$ and the corresponding time $t_i$ thereof.

Namely, the molecular beam intensity estimation unit 3 estimates the molecular beam intensity $V_O(t)$ corresponding to the time after the last converted and corresponding to the time after the last converted and stored time by successively reading out the estimated molecular beam intensity $V_{iO}$ and the corresponding time $t_i$ thereof which are stored in the memory unit 2.

In the molecular beam intensity estimation unit 3, an empirical formula $\log (V_O(t)) = C_0 + C_1 t$ is assumed, and then coefficients $C_0$ and $C_1$ are calculated by minimizing the sum of square value $\Sigma D_i^2$ in the difference $D_i = \log(V_{iO} - (C_0 + C_1 t_1))$. Furthermore, in the molecular beam intensity estimation unit 3, the molecular beam intensity $V_O(t)$ at the time (t) after the last converted and stored time based on the reference temperature $T_O$ is estimated by calculating the equation $V_O(t) = \exp(C_0 + C_1 t)$.

Note, instead of the above assumed empirical formula, another empirical formula $V_O(t) = C_0' + C_1' t$ can be assumed, and then coefficients $C_0'$ and $C_1'$ can be calculated by minimizing the sum of square value $\Sigma D_i'^2$ in the difference $D_i' = V_{iO} - (C_0' + C_1' t_i)$. Furthermore, in the molecular beam intensity estimation unit 3, the molecular beam intensity $V_O(t)$ at the time (t) after the last converted and stored time based on the reference temperature $T_O$ can be also estimated by calculating the equation $V_O(t) = C_0' + C_1' t$.

The cell temperature calculation unit 4 is used to calculate a cell temperature $T_{SP}(V_{SP})$, to realize a predetermined molecular beam intensity $V_{SP}$, given by successively inputting the estimated molecular beam intensity $V_O(t)$ and a predetermined (or required) molecular beam intensity $V_{SP}$ into the following equation, and the successively input the calculated cell temperature $T_{SP}(V_{SP})$ as an objective temperature into the cell temperature control unit 5.

$$T_{SP}(V_{SP}) = \frac{1}{\frac{1}{T_0} + \frac{1}{A}\log\frac{V_{SP}}{V_O(t)}}$$

Note, in FIG. 4, the molecular beam intensity conversion unit 1, the memory unit 2, the clock 13, the molecular beam intensity estimation unit 3, and the cell temperature calculation unit 4 may be constituted by a digital computer.

Figure 5:
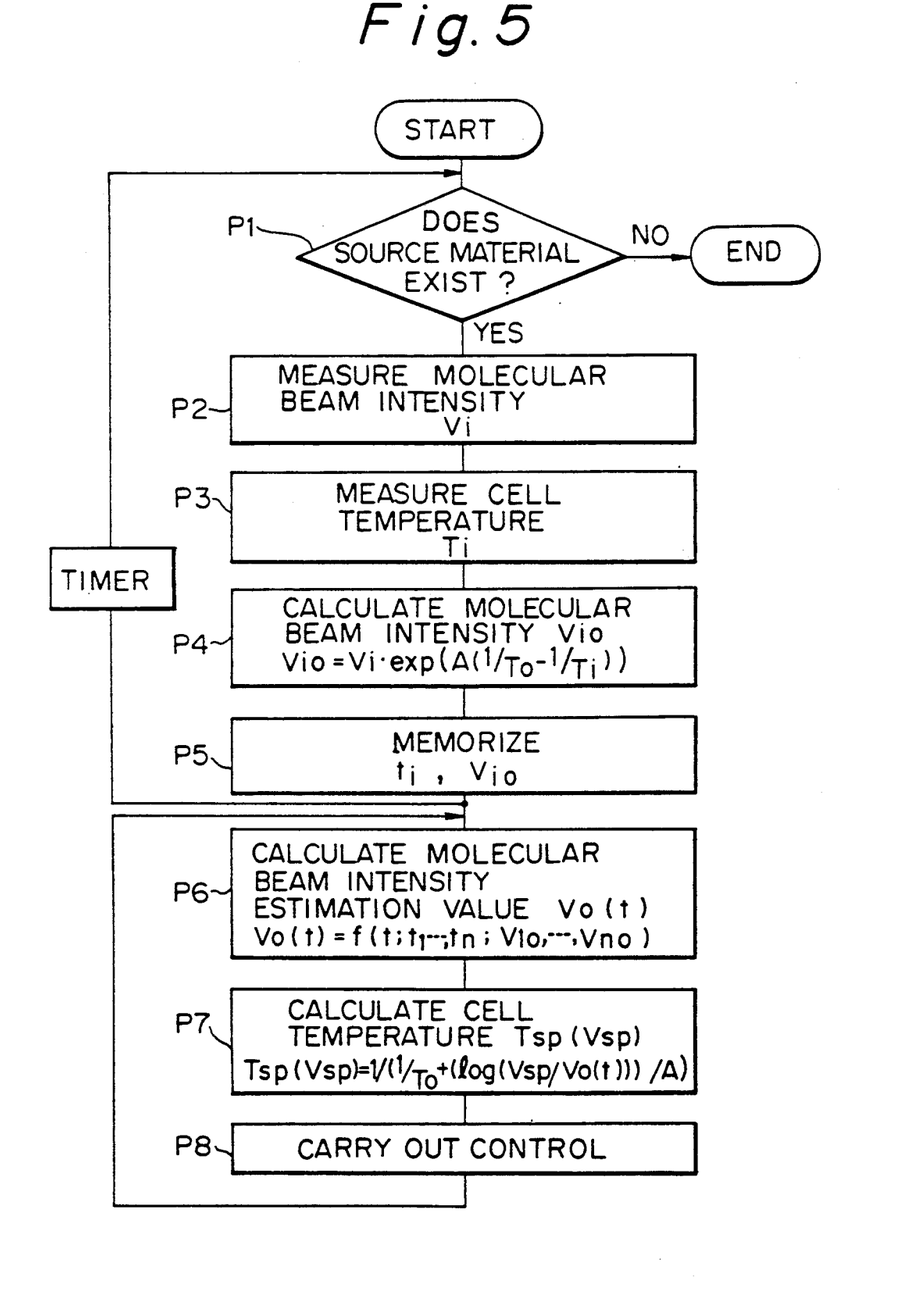
FIG. 5 is a flow chart indicating an example of control processes of the molecular beam epitaxial growth device shown in FIG. 4.

FIG. 5 is a flow chart indicating an example of control processes of the molecular beam epitaxial growth device shown in FIG. 4.

As shown in FIG. 5, when a program for controlling a molecular beam intensity is started, in a step P1, it is confirmed whether a source material (molecular beam source: Al,Ga,As, an the like) exists in a molecular beam source cell or not. In the step P1, when the source material is determined to exit (or remain), the flow proceeds to a step P2. In the step P2, an intensity $V_i$ of a molecular beam from the molecular beam source cell 11 is measured by a molecular beam intensity measurement unit 8, and the flow proceeds to a step P3. Note, in the step P1, when the source material is determined not to exist (empty), the flow is completed.

In the step P3, a temperature $T_i$ of the molecular beam source cell 11 is measured by a cell temperature measurement unit 9, and the flow proceeds to a step P4.

In the step P4, a molecular beam intensity is converted by a molecular beam intensity conversion unit 1. Namely, in the step P4, the molecular beam intensity $V_i$ measured by the molecular beam intensity measurement unit 8 and the cell temperature $T_i$ measured by the cell temperature measurement unit 9 is input into an equation of $V_{iO} = V_i \cdot \exp(A(1/T_O - 1/T_i))$, so that the converted molecular beam intensity $V_{iO}$ is derived. Note, in the above equation the reference $T_O$ denotes a reference temperature.

Further, in a step P5, a converted (estimated) molecular beam intensity $V_{iO}$ and a corresponding time $t_i$ of the converted molecular beam intensity $V_{iO}$ are stored (memorized) in a memory unit 2, and the flow proceeds to a step P6. Note, these steps from P1 to P5, or the steps P2 and P3, are carried out during predetermined time intervals which are counted by a timer (or clock 13). Furthermore, the steps P1~P5 (P2, P3) can be carried out until the source material is determined not to exist (empty). However, the steps P1~P5 (P2,P3) can be also carried out at the specific times. Preferably, the steps P1~P5 (P2,P3) are carried out at the time of growing a buffer layer on a substrate 30. In addition, the steps P1~P5 (P2,P3) are carried out when stopping the growth of an epitaxial film.

Next, in the step P6, the converted molecular beam intensity $V_{iO}$ and the corresponding time $t_i$ thereof stored in the memory unit 2 are successively read out to the molecular beam intensity estimation unit 3, and a molecular beam intensity $V_O(t)$ at a time t after the last converted and stored time based on the reference temperature $T_O$ by calculating coefficients $C_O$ and $C_1$ in an empirical formula log $(V_O(t))=C_O+C_1t$, or by calculating coefficients $C_O'$ and $C_1'$ in another empirical formula $V_O(t)=C_O'+C_1't$, which are already explained above, is derived. Further, in a step P7, the estimated molecular beam intensity $V_O(t)$ and a predetermined (or required) molecular beam intensity $V_{SP}$ are input into the cell temperature calculation unit 4, a cell temperature $T_{SP}(V_{SP})$ for realizing the predetermined molecular beam intensity $V_{SP}$ is derived by calculating the equation of $T_{SP}(V_{SP})=1/(1/T_O+(\log(V_{SP}V_O(t)))/A)$, and the flow proceeds to a step P8. In the step P8, the calculated cell temperature $T_{SP}(V_{SP})$ is successively input into a cell temperature control unit 5 as an objective temperature, and the cell temperature is controlled to be equal to the cell temperature $T_{SP}(V_{SP})$ calculated by the cell temperature control unit 5.

Figure 6:
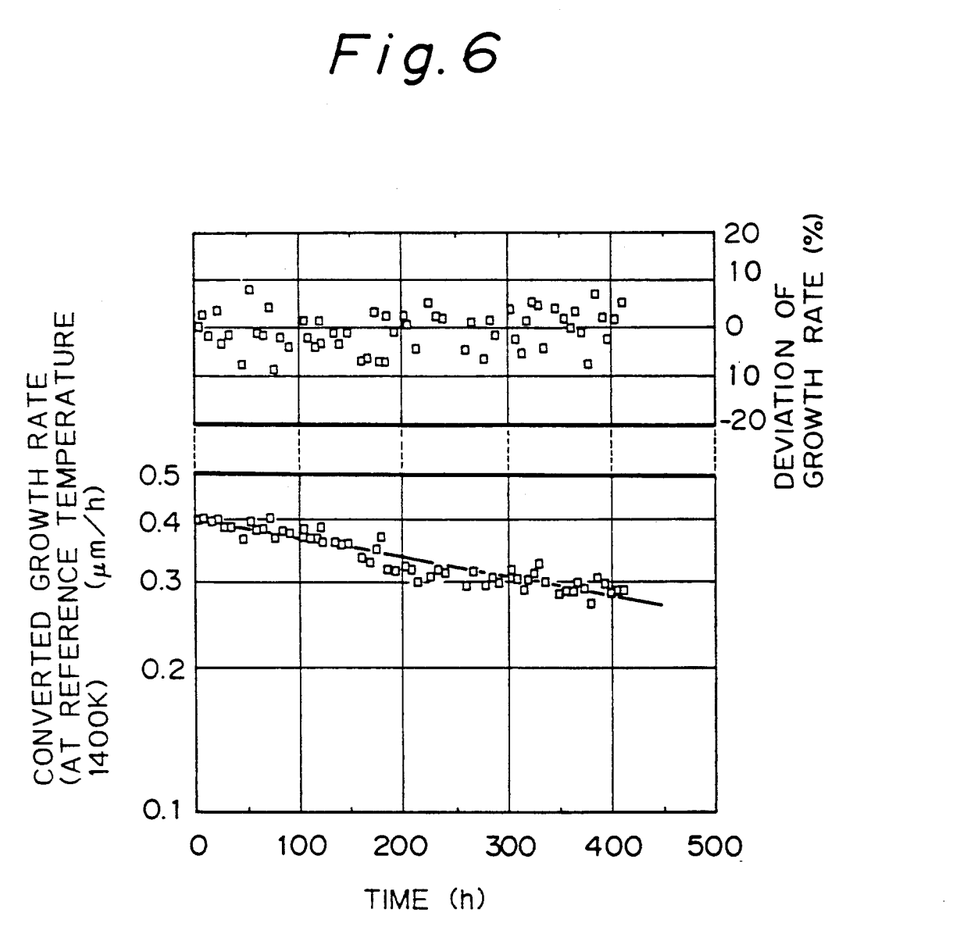
FIG. 6 is a diagram indicating the accuracy of control processes in the first embodiment according to the present invention.

FIG. 6 is a diagram indicating the accuracy of estimation processes in the first embodiment according to the present invention. In FIG. 6, the upper part of the graph indicates the relationship between deviation of growth rate and time, an the lower part of the graph indicates the relationship between the converted growth rate at a reference temperature (1400 K) and time, when forming an AlAs epitaxial film. Note, in the upper part of the graph, the deviation was defined by a difference between a predetermined (or required) molecular beam intensity $(V_{SP})$ and a measured molecular beam intensity obtained by measuring an epitaxial film thickness using a stylus profile meter. Further, the AlAs epitaxial film was formed under the conditions that a growth rate of AlAs was specified as 0.3 μm/hour, a cell temperature of Aluminum (Al) cell (11) was specified as about 1100° C., a cell temperature of arsenic (As) cell (11) was specified as about 200° C., a temperature of the substrate (30) was specified as 650° C., a pressure in the vacuum chamber (10) was specified as about $5 \times 10^{-9}$ Torr, and molecular beam intensity was measured by using an ion gage. In addition, the molecular beam intensity estimation unit 3 estimated a molecular beam intensity $V_O(t)$ at a time t by calculating coefficients $C_O$ and $C_1$ in an empirical formula log $(V_O(t))=C_O+C_1t$.

As shown in FIG. 6, through the duration of the graph, the deviations, which were defined by a difference between a predetermined molecular beam intensity and a measured molecular beam intensity, vary within a 10% difference, and thus it was proved that the estimated molecular beam intensity $V_O(t)$ coincided to the predetermined molecular beam intensity, with only a small deviation over time.

Figure 7:
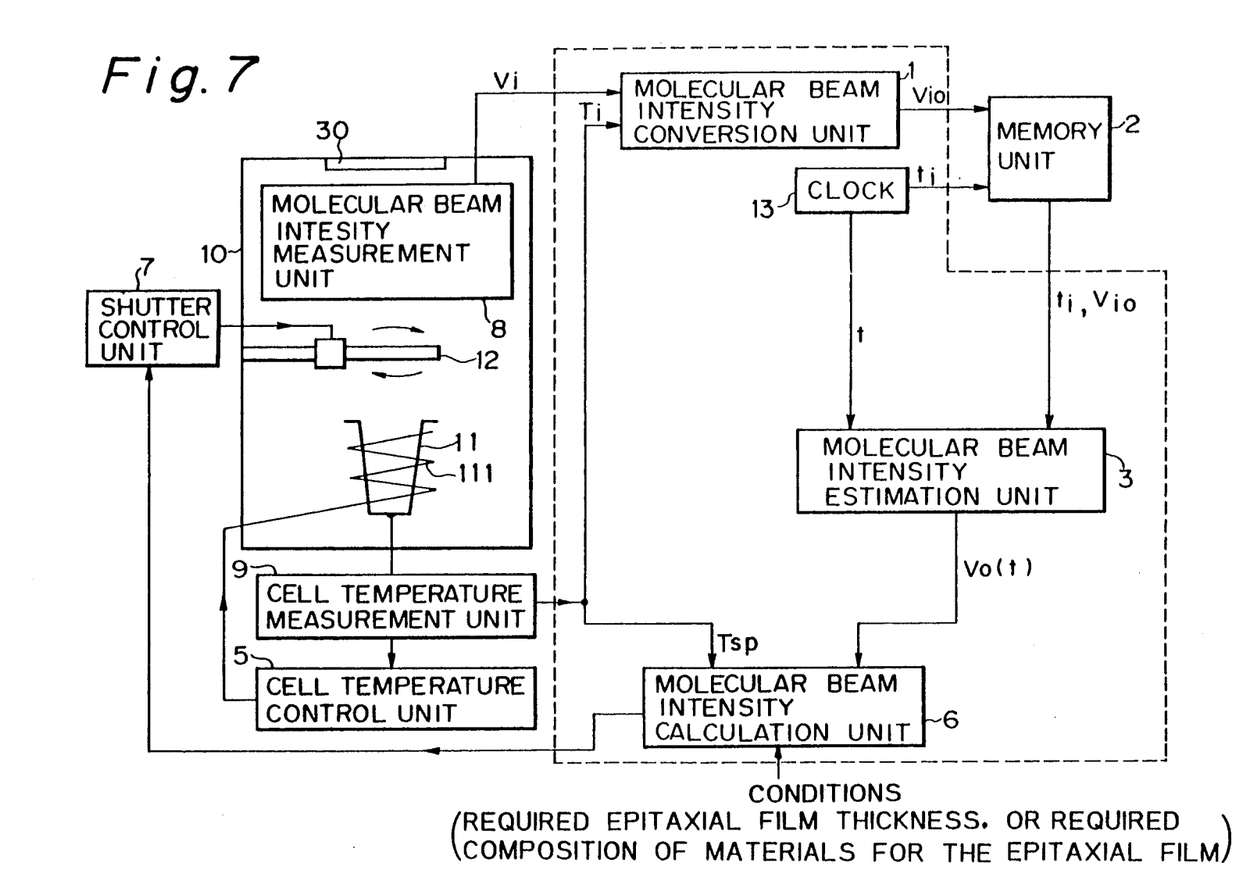
FIG. 7 is a block diagram illustrating a second embodiment of a molecular beam epitaxial growth device according to the present invention.

FIG. 7 is a block diagram illustrating a second embodiment of a molecular beam epitaxial growth device according to the present invention.

This second embodiment of a molecular beam epitaxial growth device according to the present invention is similar to the first embodiment thereof previously explained with reference to FIGS. 4 to 6. Namely, comparing the device shown in FIG. 4 to the device shown in FIG. 7, the vacuum chamber 10, the molecular beam source cell 11, the shutter 12, the molecular beam intensity measurement unit 8, and the substrate 30 have the same configurations. Furthermore, the cell temperature measurement unit 9, the cell temperature control unit 5, the molecular beam intensity conversion unit 1, the memory unit 2, the clock 13, and the molecular beam intensity estimation unit 3 also have the same configurations in the molecular beam epitaxial growth device shown in FIGS. 4 and 7.

Note, in the first embodiment of the molecular beam epitaxial growth device shown in FIG. 4, the cell temperature control unit 5 receives the calculated cell temperature $T_{SP}(V_{SP})$ from the cell temperature calculation unit 4 as an objective temperature. Nevertheless, in the second embodiment of the molecular beam epitaxial growth device shown in FIG. 7, the cell temperature calculation unit 4 is not provided, and the cell temperature control unit 5 does not receive the calculated cell temperature $T_{SP}(V_{SP})$ therefrom. Namely, in the second embodiment of the molecular beam epitaxial growth device shown in FIG. 7, a molecular beam intensity calculation unit 6 is provided instead of the cell temperature calculation unit 4, and further, a shutter control unit 7 is provided to control the shutter 12 (or an opening of the molecular beam source cell 11) in accordance with an integrated value relating to a time factor of a molecular beam intensity $V_{SP}(T_{SP})$ calculated in the molecular beam intensity calculation unit 6. Consequently, explanations of the above configurations which are the same in the devices shown in FIGS. 4 and 7 are omitted, and explanations of only the molecular beam intensity calculation unit 6 and the shutter control unit 7 will be given below.

The molecular beam intensity calculation unit 6 is used to calculate a molecular beam intensity $V_{SP}(T_{SP})$ at a cell temperature $T_{SP}$ in the time (t) of an estimated molecular beam intensity $V_O(t)$ by successively inputting the estimated molecular beam intensity $V_O(t)$ and the cell temperature $T_{SP}$ into the following equation.

$$V_{SP}(T_{SP}) = V_O(t) \cdot \exp\left(A\left(\frac{1}{T_{SP}} - \frac{1}{T_O}\right)\right)$$

Note, the cell temperature $T_{SP}$ is supplied from the cell temperature measurement unit 9 to the molecular beam intensity calculation unit 6, and the estimated molecular beam intensity $V_O(t)$ is supplied from the molecular beam intensity estimation unit 3 to the molecular beam intensity calculation unit 6. Note, the molecular beam intensity calculation unit 6 receives conditions indicating a required epitaxial film thickness or a required composition of materials for the epitaxial film.

As explained above, the molecular beam intensity estimation unit 3 estimates the molecular beam intensity $V_O(t)$ corresponding to the time after the last converted and stored time by successively reading out the estimated molecular beam intensity $V_{iO}$ and the corresponding time $t_i$ thereof which are stored in the memory unit 2. In the molecular beam intensity estimation unit 3, an empirical formula log $(V_O(t))=C_O+C_1t$ is assumed, and then coefficients $C_O$ and $C_1$ are calculated by minimizing the sum of square value $\Sigma D_i^2$ in the difference $D_i=\log(V_{iO}-(C_O+C_1t_i))$. Furthermore, in the molecular beam intensity estimation unit 3, the molecular beam intensity $V_O(t)$ at the time (t) after the last converted and stored time based on the reference temperature $T_O$ is estimated by calculating the equation $V_O(t)=\exp(o+C_1t)$. Note, instead of the above assumed empirical formula, another empirical formula $V_O(t)=C_O'+C_1't$ can be assumed, and then coefficients $C_O'$ and $C_1'$ can be calculated by minimizing the sum of square value $\Sigma D_i'^2$ in the difference $D_i'=V_{iO}-($ $C_O' + C_1' t_i$). Furthermore, in the molecular beam intensity estimation unit 3, the molecular beam intensity $V_O(t)$ at the time (t) after the last converted and stored time based on the reference temperature $T_O$ can be also estimated by calculating the equation $V_O(t) = C_O' + C_1' t$.

The shutter control unit 7, which is connected to the shutter 12 of the molecular beam source cell 11 and receives the calculated molecular beam intensity $V_{SP}(T_{SP})$, is used to control the shutter 12 (or an opening of the molecular beam source cell 11) in accordance with an integrated value relating to the time factor of the molecular beam intensity $V_{SP}(T_{SP})$.

Note, in FIG. 7, the molecular beam intensity conversion unit 1, the memory unit 2, the clock 13, the molecular beam intensity estimation unit 3, and the molecular beam intensity calculation unit 6 may be constituted by a digital computer.

Figure 8:
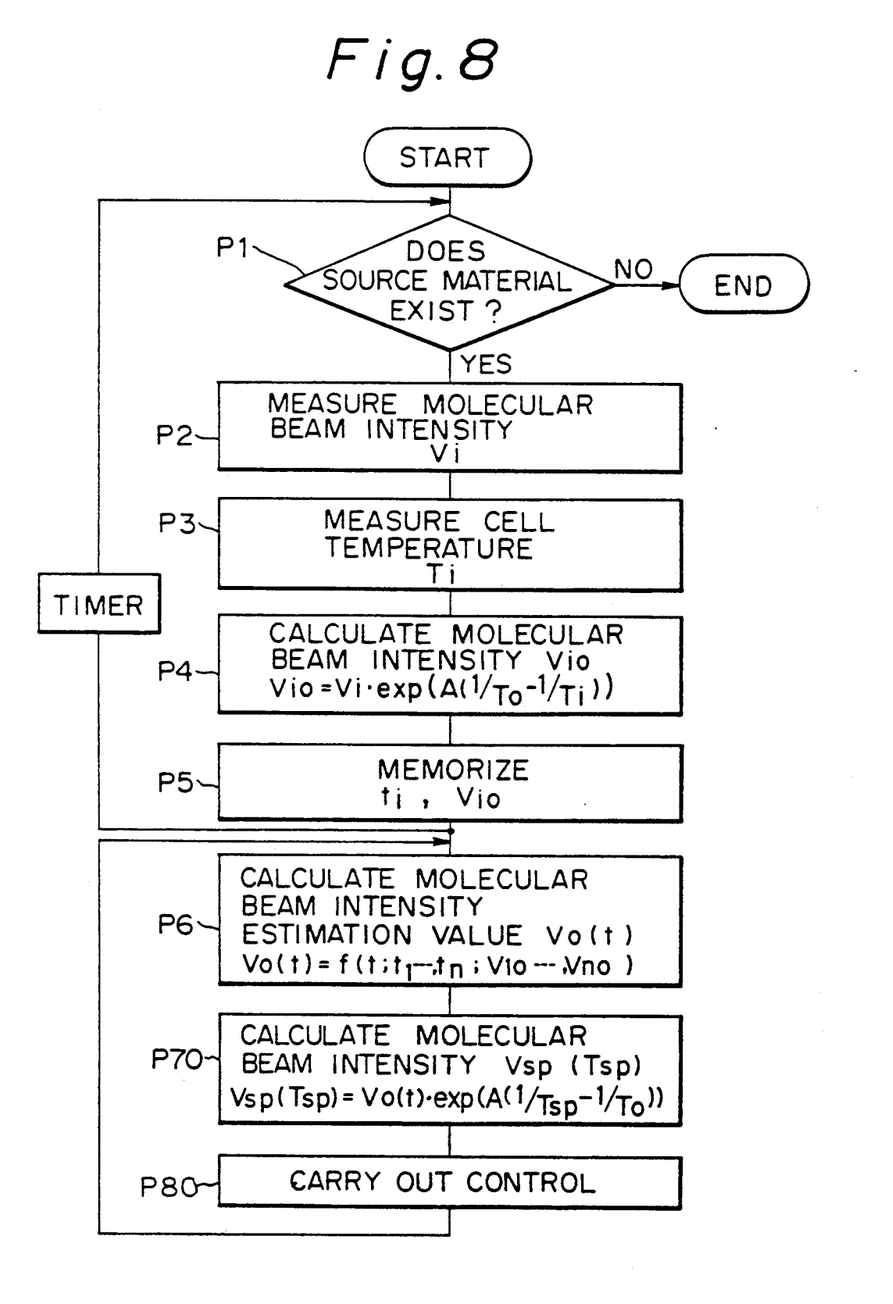
FIG. 8 is a flow chart indicating an example of control processes of the molecular beam epitaxial growth device shown in FIG. 7.

FIG. 8 is a flow chart indicating an example of control processes of the molecular beam epitaxial growth device shown in FIG. 7. As described above, this second embodiment of the molecular beam epitaxial growth device according to the present invention is similar to the first embodiment thereof previously explained with reference to FIGS. 4 to 6. Namely, comparing the flow chart shown in FIG. 5 to the flow chart shown in FIG. 8, the steps P1 to P6 are the same processes. Consequently, explanations of the processes in the steps P1 to P6, which are the same as the processes in the first and the second embodiments, are omitted, and explanations mainly for only steps P70 and P80 will be given below.

As described above, in the step P6, the converted molecular beam intensity $V_{iO}$ and the corresponding time $t_i$ thereof stored in the memory unit 2 are successively read out to the molecular beam intensity estimation unit 3, and a molecular beam intensity $V_O(t)$ at a time t after the last converted and stored time based on the reference temperature $T_O$ by calculating coefficients $C_O$ and $C_1$ in an empirical formula log $(V_O(t)) = C_O + C_1 t$, or by calculating coefficients $C_O'$ and $C_1'$ in another empirical formula $V_O(t) = C_O' + C_1' t$, which have already been explained above. Next, in a step P70, the estimated molecular beam intensity $V_O(t)$ and a cell temperature $T_{SP}$ are input into the molecular beam intensity calculation unit 6, a molecular beam intensity $V_{SP}(T_{SP})$ at a cell temperature $T_{SP}$ is calculated by the following equation using the estimated molecular beam intensity $V_O(t)$ and the cell temperature $T_{SP}$ at the time (t) of the estimated molecular beam intensity $V_O(t)$; $V_{SP}(T_{SP}) = V_O(t) \cdot \exp(1/T_{SP} - 1/T_O)$), and the flow proceeds to a step P80. In the step P80, a shutter 12 of the molecular beam source cell 11 is controlled by the shutter control unit 7 in accordance with an integrated value relating to the time factor of the calculated molecular beam intensity $V_{SP}(T_{SP})$.

In the above description, the molecular beam intensity measurement unit 8, which is shown in FIGS. 4 and 7, can be constituted by, for example, an RHEED (RHEED intensity oscillation observation device), an ion gauge, a film thickness measurement apparatus, or the like. Further, the molecular beam intensity conversion unit 1 and the cell temperature calculation unit 4 (or the molecular beam intensity calculation unit 6) shown in FIG. 4 (FIG. 7) can be constituted by an analog computer or a digital computer. Note, when using the analog computer, the cell temperature control unit 5 should also analog input-output processes. In addition, the memory unit 2 can be constituted by a semiconductor memory device, a magnetic disk device, and the like.

Furthermore, when forming (or growing) group III-V compound semiconductor crystal (epitaxial film), generally, the intensity of the group III element (material) must be exactly controlled, but the intensity of the group V element (material) need not be exactly controlled as in the group III material. Note, the group III material is, for example, Aluminum (Al), Gallium (Ga), Indium (In), and the like, and the group V material is, for example, Phosphorus (P), Antimony (An), Arsenic (As), and the like. Concretely, when forming an AlAs epitaxial film, be controlling only the intensity of the material Al (group III) exactly, the intensity (quantity) of the material As (in group V) is determined by combining it with the material Al. Note, the epitaxial film formed by the molecular beam epitaxial growth device according to the present invention is, for example, a compound semiconductor made of group III-V materials, e.g., AlAs, AlGaAs, GaAs, GaAsSb, InGaAs, InAlAs, and the like.

Many widely differing embodiments of the present invention may be constructed without departing from the spirit and scope of the present invention, and it should be understood that the present invention is not limited to the specific embodiments described in this specification, except as defined in the appended claims.

I claim:

1. A molecular beam control method in a molecular beam epitaxial growth device comprising the steps of:

measuring a temperature $T_i$ of a molecular beam source cell;

measuring an intensity $V_i$ of a molecular beam from said molecular beam source cell;

converting the measured molecular beam intensity $V_i$ into a value $V_{iO}$ at a reference temperature $T_O$ by calculating the following equation using the measured molecular beam intensity $V_i$ and the measured cell temperature $T_i$, $$V_{io} = V_i \cdot \exp\left(A\left(\frac{1}{T_o} - \frac{1}{T_i}\right)\right)$$

estimating a molecular beam intensity $V_O(t)$ at a time (t) after the last conversion time based on the reference temperature $T_O$ in accordance with the converted molecular beam intensity $V_{iO}$ and a corresponding time $t_i$ thereof; and controlling a temperature of said molecular beam source cell in accordance with an estimated cell temperature $T_{SP}(V_{SP})$, to realize a predetermined molecular beam intensity $V_{SP}$, given by calculating the following equation using the estimated molecular beam intensity $V_O(t)$ and the predetermined molecular beam intensity $V_{SP}$, $$T_{SP}(V_{SP}) = \frac{1}{\frac{1}{T_o} + \frac{1}{A}\log\frac{V_{SP}}{V_O(t)}}.$$

2. A molecular beam control method, as claimed in claim 1, wherein the step of measuring the temperature $T_i$ of said molecular beam source cell and the step of measuring the intensity $V_i$ of the molecular beam from said molecular beam source cell are carried out at the time of growing a buffer layer on a substrate, and the step of controlling the temperature of said molecular beam source cell is carried out at the time of growing a device layer on said substrate.

3. A molecular beam control method, as claimed in claim 1, wherein the step of measuring the temperature $T_i$ of said molecular beam source cell and the step of measuring the intensity $V_i$ of the molecular beam from said molecular beam source cell are carried out when stopping the growth of an epitaxial film.

4. A molecular beam control method, as claimed in claim 1, wherein said molecular beam control method is used for forming a compound semiconductor made of group III-V materials.

5. A molecular beam control method, as claimed in claim 4, wherein said group III materials include Aluminum, Gallium, or Indium, and said group V materials include Phosphorus, Antimony or Arsenic.

6. A molecular beam control method, as claimed in claim 4, wherein the step of measuring the temperature $T_i$ of said molecular beam source cell and the step of measuring the intensity $V_i$ of the molecular beam from said molecular beam source cell are carried out for only said group III materials.

7. A molecular beam control method in a molecular beam epitaxial growth device comprising the steps of:
measuring a temperature $T_i$ of a molecular beam source cell;
measuring an intensity $V_i$ of a molecular beam from said molecular beam source cell;
converting the measured molecular beam intensity $V_i$ into a value $V_{iO}$ at a reference temperature $T_O$ by calculating the following equation using the measured molecular beam intensity $V_i$ and the measured cell temperature $T_i$, $$V_{iO} = V_i \cdot \exp\left(A\left(\frac{1}{T_o} - \frac{1}{T_i}\right)\right)$$

estimating a molecular beam intensity $V_O(t)$ at a time (t) after the last conversion time based on the reference temperature $T_O$ in accordance with the converted molecular beam intensity $V_{iO}$ and a corresponding time $t_i$ thereof;
calculating a molecular beam intensity $V_{SP}(T_{SP})$ at a cell temperature $T_{SP}$ by calculating the following equation using the estimated molecular beam intensity $V_O(t)$ and the cell temperature $T_{SP}$ at the time (t) of the estimated molecular beam intensity $V_O(t)$, $$V_{SP}(T_{SP}) = V_O(t) \cdot \exp\left(A\left(\frac{1}{T_{SP}} - \frac{1}{T_O}\right)\right)$$

and controlling a shutter of said molecular beam source cell by using an integrated value relating to the time factor of the molecular beam intensity $V_{SP}(T_{SP})$.

8. A molecular beam control method, as claimed in claim 7, wherein the step of measuring the temperature $T_i$ of said molecular beam source cell and the step of measuring the intensity $V_i$ of the molecular beam from said molecular beam source cell are carried out at the time of growing a buffer layer of a substrate.

9. A molecular beam control method, as claimed in claim 7, wherein the step of measuring the temperature $T_i$ of said molecular beam source cell and the step of measuring the intensity $V_i$ of the molecular beam from said molecular beam source cell are carried out when stopping the growth of an epitaxial film.

10. A molecular beam control method, as claimed in claim 7, wherein said molecular beam control method is used for forming a compound semiconductor made of group III-V materials.

11. A molecular beam control method, as claimed in claim 10, wherein said group III materials include Aluminum, Gallium, or Indium, and said group V materials include Phosphorus, Antimony or Arsenic.

12. A molecular beam control method, as claimed in claim 10, wherein the step of measuring the temperature $T_i$ of said molecular beam source cell and the step of measuring the intensity $V_i$ of the molecular beam from said molecular beam source cell are carried out for only said group III materials.

* * * * *

UNITED STATES PATENT AND TRADEMARK OFFICE
CERTIFICATE OF CORRECTION

PATENT NO. : 5,096,533

DATED : March 17, 1992

INVENTOR(S) : Takeshi IGARASHI

It is certified that error appears in the above-identified patent and that said Letters Patent is hereby corrected as shown below:

Col. 1, line 11, change ",," to --,--.

Col. 2, line 53, change "$V_i$" (second occurrence) to --$\bar{V}_i$--

Col. 4, line 30, change "cells" to --cell--;
line 34, change "cell" to --cells--.

Col. 5, line 32, delete "$\pi$".

Col. 6, line 32, change "(8" to --[--.

Col. 8, line 33, change "oat" to --at--.

Col. 10, line 59, delete "three".

Col. 11, line 36, change "an" to --and--.

Col. 12, line 28, change "an" to --and--;
line 30, change "exit" to --exist--.

Col. 13, line 25, change "an" to --and--;
line 42, change "gage" to --gauge--.

Col. 16, line 44, after the equation, insert --;--;
line 46, start a new paragraph with the word "estimating".

UNITED STATES PATENT AND TRADEMARK OFFICE
CERTIFICATE OF CORRECTION

PATENT NO. : 5,096,533

DATED : March 17, 1992

INVENTOR(S) : Takeshi IGARASHI

It is certified that error appears in the above-identified patent and that said Letters Patent is hereby corrected as shown below:

Col. 17, line 40, after the equation, insert --;--.

Col. 18, line 11, after the equation, insert --;--.

Signed and Sealed this

Twenty-sixth Day of October, 1993

Attest:

BRUCE LEHMAN

Attesting Officer  Commissioner of Patents and Trademarks